United States Patent
Evans, III

[19]

[11] Patent Number: 6,163,064
[45] Date of Patent: *Dec. 19, 2000

[54] APPARATUS FOR IMPROVED OPERATION OF MOSFET DEVICES IN CRYOGENIC ENVIRONMENTS

[75] Inventor: Robert Rogers Evans, III, Framingham, Mass.

[73] Assignee: American Superconductor Corporation, Westborough, Mass.

[ * ] Notice: This patent issued on a continued prosecution application filed under 37 CFR 1.53(d), and is subject to the twenty year patent term provisions of 35 U.S.C. 154(a)(2).

[21] Appl. No.: 08/698,794

[22] Filed: Aug. 16, 1996

[51] Int. Cl.[7] .................................................. H01L 29/00
[52] U.S. Cl. ............................ 257/532; 257/536; 363/14
[58] Field of Search ..................... 257/532, 536, 257/713, 714, 716; 327/146; 363/14; 437/248

[56] References Cited

U.S. PATENT DOCUMENTS

| | | |
|---|---|---|
| 4,692,643 | 9/1987 | Tokunaga et al. ....................... 327/146 |
| 5,028,988 | 7/1991 | Porter et al. ............................ 257/716 |
| 5,040,053 | 8/1991 | Porter et al. ............................ 257/716 |
| 5,119,175 | 6/1992 | Long et al. ............................... 357/82 |
| 5,166,776 | 11/1992 | Dederer et al. ......................... 257/716 |

FOREIGN PATENT DOCUMENTS

| | | |
|---|---|---|
| 06164347 | 6/1994 | Japan . |
| 6-164347 | 6/1994 | Japan . |

*Primary Examiner*—Sara Crane
*Attorney, Agent, or Firm*—Choate, Hall & Stewart

[57] ABSTRACT

An electronic circuit that comprises a MOSFET device includes source, drain and gate terminals and operates at cryogenic temperatures. The circuit includes a snubber that is connected between the source and drain terminals of the MOSFET and that has capacitance but substantially no resistance. A control element, which is coupled to at least the gate terminal of the MOSFET device, turns the device "on" (i.e., it effects conduction in the MOSFET) by selectively applying a voltage to the gate terminal that is positive with respect to the source terminal and with respect to ground. The circuit further includes a resistive load, e.g., a resistor, that is coupled in series between the control element and the gate terminal. The control element selectively applies negative-going voltage to the gate terminal, e.g., when the MOSFET is not on.

31 Claims, 5 Drawing Sheets

APPARATUS FOR IMPROVED OPERATION OF MOSFET DEVICES IN CRYOGENIC ENVIRONMENTS

BACKGROUND OF THE INVENTION

The invention pertains to power electronics and, particularly, to extending the operating range of metal oxide semiconductor field effect transistors (MOSFETs) used in cryogenic applications.

Metal oxide semiconductor field effect transistors (MOSFETs) are used as switches in electronic circuits. MOSFETs, which can be turned "on" to pass electrical currents and "off" to stop those currents, are controlled electrically and operate extremely rapidly. Thus, they are ideal for use in high-speed switching applications, such as power electronics, where current flows are sometimes started and stopped millions of times per second.

As with most electrical devices, MOSFETs are constrained to operate within specific power, temperature and switching ranges. For example, a MOSFET that is operating at room temperature, with a gate-to-source voltage of 20 volts, and a switching rate of 10,000 cycles/sec, may be limited to passing currents on the order of 10 amps. Though the so-called safe operating areas (SOAs) of MOSFETs are well known, it is often difficult to insure that the SOA of a given MOSFET will not be exceeded, at least momentarily, during circuit operation. This is particularly true where a MOSFET is operated close to the limits of its SOA.

Transients are a well known phenomena in electrical circuits. When MOSFET devices are switched on and off, they induce transients in the surrounding circuitry. Those transients may prove harmless for MOSFETs operating well within their SOAs. However, as the operational limits of the MOSFETs are approached, the transients may push voltages and currents beyond the SOAs, causing electrical ruptures of the delicate metallic and semiconductor structures within the devices.

Although the prior art suggests the use of "snubber" circuitry to squelch the deleterious effect of transient on MOSFETs, that additional circuitry can be costly when used in the quantities required for power electronics, where banks of hundreds of MOSFETs may be employed in switching large currents.

In view of the foregoing, an object of the invention is to provide improved power electronics and, particularly, improved MOSFET switching circuitry.

A more particular object of the invention is to provide power MOSFET switching circuitry for use in cryogenic applications, such as low temperature superconducting (LTS) devices and high temperature superconducting (HTS) devices.

A still further object of the invention is to provide such power MOSFET switching devices that can operate in cryogenic environments close to the limits of their SOAs without risk of failure.

Yet still another object of the invention is to provide such power MOSFET switching devices as can be implemented at low cost.

A still further object of the invention is to provide such power MOSFET switching devices as occupy a minimum of space.

SUMMARY OF THE INVENTION

These and other objects are attained by the invention which provides, in one aspect, an improved snubber for a MOSFET device that operates at cryogenic temperatures. The snubber comprises a capacitor or other capacitive load that has substantially no resistance. The snubber has application where the MOSFET device is maintained at LTS temperatures (i.e., 4° K–20° K) or at traditional or extended HTS temperature ranges (i.e., 20° K–77° K and 20° K–236° K, respectively). The snubber is advantageous over prior art snubbers in that it requires fewer components (e.g., a capacitor alone, instead of a capacitor, resistor and diode) and, therefore, is less expensive and occupies less space.

In another aspect, the invention provides an electronic circuit that comprises a MOSFET device that operates at cryogenic temperatures, as above. The circuit includes a snubber that is connected between the source and drain terminals of the MOSFET and that has capacitance, but substantially no resistance. A control element, which is coupled to at least the gate terminal of the MOSFET device, turns the device "on" (i.e., it effects conduction in the MOSFET) by selectively applying a voltage to the gate terminal that is positive with respect to the source terminal and with respect to ground.

In a related aspect, the electronic circuit includes a resistive load, e.g., a resistor, that is coupled in series between the control element and the gate terminal. That load controls the change in current flow with respect to time (di/dt) of the MOSFET by controlling the gate to source voltage, and can be selected to reduce the likelihood of current overruns during the reverse recovery phase of the MOSFET's intrinsic diode.

In yet another related aspect, the control element applies a negative-going voltage to the gate terminal when the MOSFET is not on. That negative-going voltage, which is negative with respect to the source terminal and with respect to ground, immunizes the MOSFET from being erroneously turning on as a result of coupling between the MOSFET's intrinsic drain-to-gate capacitor.

These and other aspects of the invention are evident in the drawings and in the description that follows.

BRIEF DESCRIPTION OF THE DRAWINGS

A more complete understanding of the invention may be attained by reference to the drawings, in which.

DETAILED DESCRIPTION OF THE ILLUSTRATED EMBODIMENT

Figure 1A:
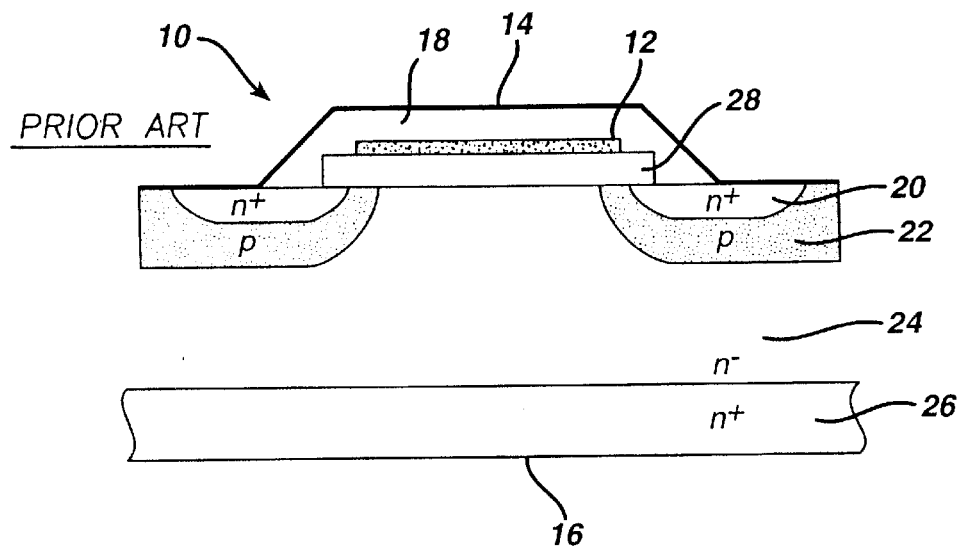
FIGS. 1A–1C depict the structure, operation and circuit diagram of a MOSFET device of the type used in practice of the invention.

FIG. 1A depicts the structure of a conventional MOSFET device 10. The device 10 has three electrical contacts for use in controlling and passing current through it. These are referred to as the "gate" 12, the "source" 14 and the "drain" 16. The contacts are separated from one another by layers of oxides and of semiconducting materials. Thus, gate 12 is separated from source 14 by oxide layer 18. The periphery of source 14 is separated from drain 16 by alternating layers of doped semiconducting layers, including n$^+$-type layer 20, p-type layer 22, n$^-$-type layer 24 and n$^+$-type layer 26, as shown. These layers are referred to as the "body" of the MOSFET. Gate 12 is separated from n$^+$-type layer 20, p-type layer 22, and n$^-$-type layer 24 by oxide layer 28.

The operation of MOSFET device 10 is well known. Unless the gate 12 is positively biased with respect to the source 14, no current can flow from the drain 16 to the source 14. This is a result of the differing electrical properties of the various semiconducting layers 20–26 that separate the source 14 from the drain 16. The junction formed between n$^+$-type layer 20 and p-type layer 22 is of "opposite polarity" to the junction formed between n$^-$-type layer 24 and p-type layer 22, thus, preventing any current flow absent a biasing voltage.

Figure 1B:
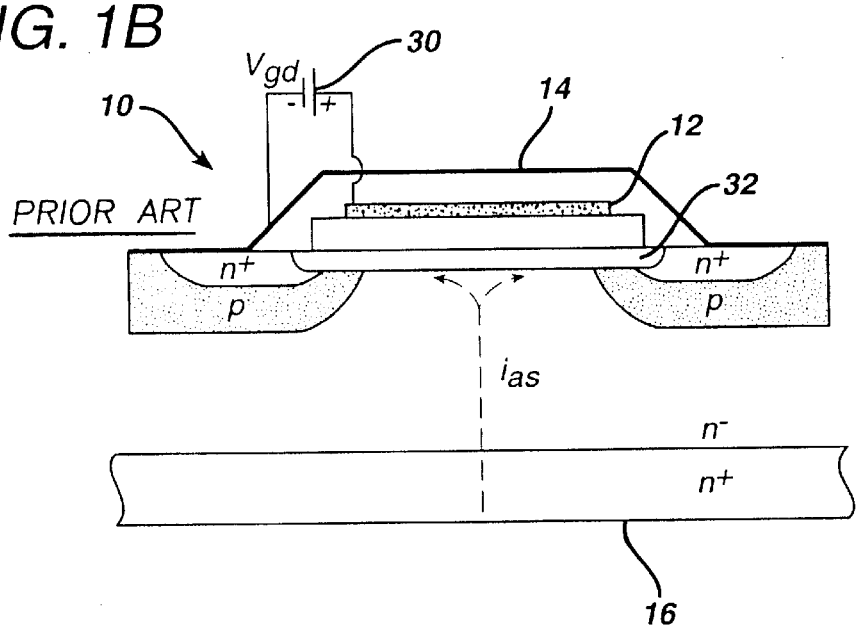

As shown in FIG. 1B, if gate 12 is forward biased with respect to the source 14 (e.g., by voltage source 30), a depletion zone 32 is created in the body of the MOSFET, permitting current $i_{ds}$ to flow from the drain 16 to source 14. The minimal level of forward biasing necessary to induce a depletion zone is referred to as $V_{TH}$ and is, typically, about 2.5 volts.

In practice, MOSFET device 10 represents only a portion, or a cell, of a commercially available MOSFET. The commercial available devices typically comprise thousands of such cells connected in parallel. This reduces overall device resistance and improves its gain.

Grossly speaking, MOSFET device 10 may be characterized as a current switch, where the current $i_{ds}$ is a function of the gate-to-source voltage differential, $V_{gs}$, and the drain-to-source voltage differential, $V_{ds}$. As noted above, where $V_{gs}$ is below a threshold $V_{TH}$, the current $i_{ds}$ is essentially zero (ignoring trickle currents). Where $V_{gs}$ is greater than $V_{TH}$, the current $i_{ds}$ is a function of $V_{ds}$ for smaller values of $V_{ds}$, while $i_{ds}$ is a constant for larger values of $V_{ds}$.

A complete understanding of the structure and operation of a conventional MOSFET device 10 may be attained by reference to Williams, *Power Electronics* (Wiley & Sons 1987), at Section 3.2, the teachings of which are incorporated herein by reference.

Figure 1C:
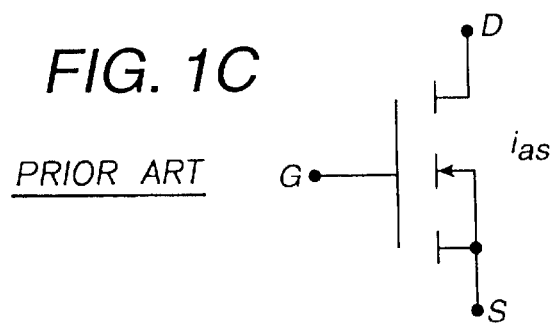

The conventional circuit symbol for a MOSFET is shown in FIG. 1C.

As noted above, the a conventional MOSFET device 10 is constrained to operate within specific power, temperature and switching ranges. An illustration of the safe operating area of a MOSFET is shown and discussed, by way of example, in Whitaker, *AC Power Systems*, (Multiscience Press 1991), at Section 3.3.1, the teachings of which are incorporated herein by reference.

The effects of "second order," or intrinsic, circuit elements or devices that are inherent in the structure of MOSFET device 10 can cause unpredictable operation and even failure, especially when the device is operating near the limits of the SOA. These intrinsic devices may cause or respond to transients by pushing voltages and currents beyond the SOA, causing electrical ruptures of the delicate metallic and semiconductor structures within the switching devices, and/or by causing the MOSFET to unexpectedly begin conducting current.

Figure 2A:
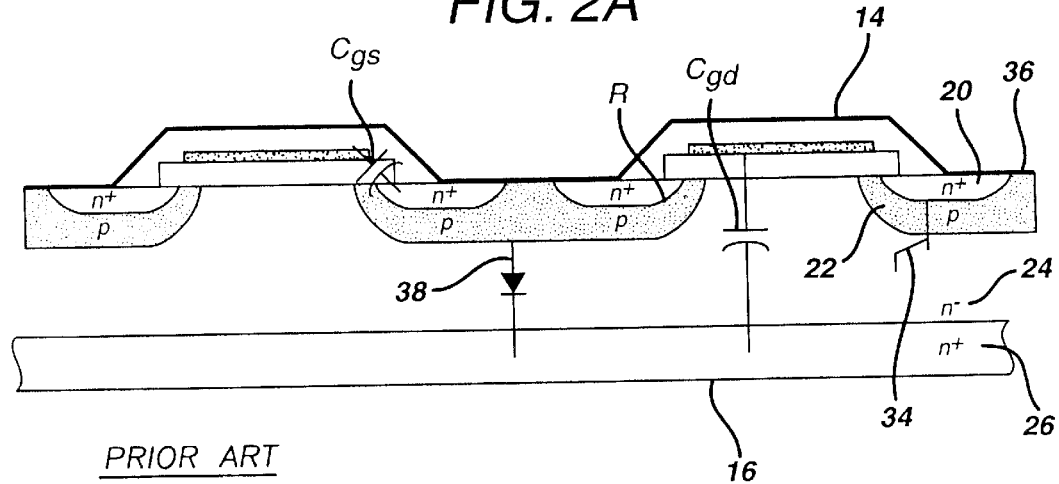
FIG. 2A depicts circuit elements intrinsic to a MOSFET device.

FIG. 2A shows several of the intrinsic devices inherent to a commercially available MOSFET device. For ease of illustration two parallel cells, constructed and operated in the manner of device 10 of FIG. 1A, are shown. The semiconducting layers of the device shown in FIG. 2A are labelled like those of device 10 of FIG. 1A.

Referring to FIG. 2A, adjacent doped semiconductor layers 20, 22 and 24 define an intrinsic bipolar junction transistor-type (BJT-type) transistor 34. The body of the MOSFET, or p layer 22, defines the base of transistor 34. The n$^+$ layer 20, in combination with source terminal 14, define the emitter of the transistor 34. The n$^-$ layer 24 and n$^+$ layer 26, in combination with drain terminal 16, define the collector of the transistor 34.

To minimize the adverse effects of BJT transistor 34 on MOSFET operation, manufacturers typically short the transistor 34 base to the emitter by placing the source terminal 14 in electrical contact with the p layer 22; see body-short 36. This effectively converts the transistor into a diode between the MOSFET source 14 and drain 16. The resulting intrinsic diode 38 is often beneficially used when the MOSFET is employed, e.g., as a rectifier.

In addition to the transistor 34 and diode 38, capacitances and resistances between the terminals and layers of the MOSFET effect its operation. Among these are gate-to-drain capacitance $C_{gd}$, gate-to-source capacitance $C_{gs}$, and resistance R between n$^+$ layer 20 and p layer 22.

A more complete understanding of the intrinsic devices in a MOSFET may be attained be reference to Mohan, *Power Electronics* (2nd Ed.) (Wiley & Sons 1995) at Sections 22-2 and 22-5, the teachings of which are incorporated herein by reference.

Figure 2B:
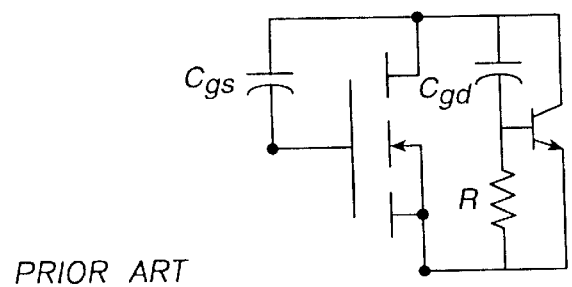
FIG. 2B depicts the circuit diagram of a MOSFET, including its intrinsic circuit elements.

FIG. 2B is a circuit diagram showing the MOSFET and the aforementioned intrinsic devices.

Figure 3A:
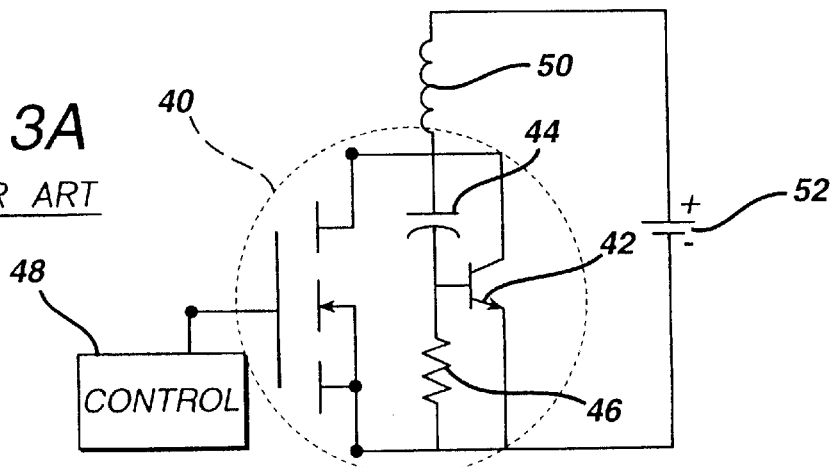
FIGS. 3A–3B depict an electronic circuit including a MOSFET device and the transients effected by switching thereof.

FIG. 3A depicts an electronic circuit including a MOSFET 40, as well as several of its intrinsic devices, to wit, BJT transistor 42, capacitor 44 and resistor 46. The circuit further includes a control element 48, for selectively biasing the gate of the MOSFET 40, to switch it "on" and "off" in order to control the passage of current. The remainder of the circuit is represented by inductive load 50 and voltage source 52. Those skilled in the art will appreciate that inductive load may represent any number of electronic devices, or combinations, thereof. For purposes of the present discussion, however, it is the induction of such devices (or their leads) that is of interest.

In normal operation, current flow through MOSFET 40 and inductor 50 is controlled by control element 48, which selectively applies a voltage to the gate of the MOSFET to bias it positively with respect to the source and, thereby, to turn on (i.e., effect conduction in) the MOSFET. As a result of the co-action of inductive load 50 and the inherent capacitor 44, voltage (and current) transients are induced whenever the MOSFET is switched on or off.

Figure 3B:
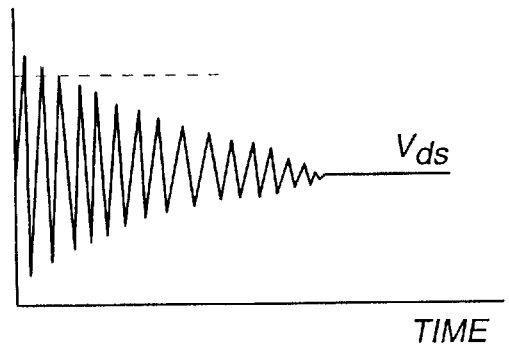

Generally, when a solid state device, such as MOSFET 40, is used as a switch, the voltage across the device jumps from essentially zero to the full voltage that is being switched. This voltage jump always induces ringing because of the "stray" capacitance (such as the junction capacitance) across the device and the lead inductance (and any lumped capacitance and inductance). FIG. 3B illustrates such a transient in the form of "ringing" in the drain-to-source voltage $V_{ds}$. The ringing voltage adds to the voltage being switched, and as such could cause the SOA to be exceeded.

Where the MOSFET 40 is operating near the limits of its SOA, the rapid voltage change can have two adverse effects. First, it can induce a current in the short circuited base-to-emitter junction of the intrinsic transistor 34. This current can cause the transistor 34 to turn on and, as a result, current will flow between the device drain 16 and source 14 connections of the MOSFET. This conduction is likely to lead to high power dissipation and device failure. Second, the inherent gate to drain capacitance $C_{gd}$ of the MOSFET couples the rapid voltage change of the drain into the MOSFET gate 12, possibly biasing the MOSFET into the "on" or conducting state. This can have the same consequences as turning on the intrinsic transistor 34.

Figure 3C:
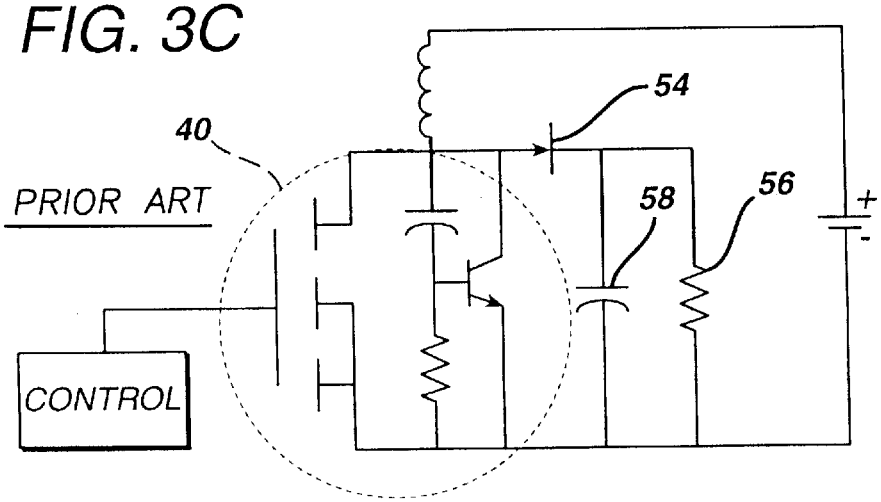
FIG. 3C depicts the circuit of FIG. 3A including a prior art snubber.

A snubber is typically used to limit the effects of the rapid voltage changes and, particularly, to prevent rapid voltage changes from causing unwanted turn on of the intrinsic transistor 34 or MOSFET. FIG. 3C illustrates the circuit of FIG. 3A including a prior art snubber. The prior art snubber comprises a diode 54, resistor 56, and capacitor 58, connected as shown. The snubber circuit of FIG. 3C works as follows: whenever the voltage $V_{ds}$ to be snubbed exceeds the voltage on the capacitor 58, the diode 54 turns on and the capacitor 56 and resistor 58 are connected across the drain and source of the MOSFET 40. Energy is absorbed by the capacitor, limiting the rise of $V_{ds}$ (the capacitor 56 actually resonates with the stray inductance to create a much lower frequency oscillation than the stray capacitance would slowing down the rate of change of the voltage). The capacitor is sized so as to limit the peak voltage excursion to a safe, i.e. non-destructive, level. This will be well understood by those of ordinary skill in the art in view of the teachings herein. When the voltage across the MOSFET is less than the voltage across the capacitor 56, the diode 54 turns off and the capacitor voltage begins to be discharged through the resistor 56. The diode 54 insures that the resistor 58 and capacitor 56 are only connected across the drain to source junction when the transient occurs, and in the normal on state they are not in the circuit (the diode is back-biased).

The prior art teaches that capacitive-type snubbers must include a resistor 56. See, for example, Mohan, *Power Electronics*, supra, at Sec. 27-2-1. See also, Whitaker, *AC Power Systems*, (Multiscience Press 1991), FIGS. 3.11–3.12.

To the contrary, I have discovered that a capacitor alone provides adequate snubbing for MOSFETs operating at cryogenic temperatures and, more particularly, at temperatures normally used in connection with superconducting electronics. This includes the so-called high temperature superconducting (HTS) temperature ranges of ceramic superconducting elements, to wit, 20°–77° K (traditional) or 20° K–236° K (extended), and the so-called low temperature superconducting (LTS) temperature ranges of metallic superconducting elements, to wit, 4°–20° K.

When a capacitor is used as a snubber for a MOSFET, the power circuit alternately charges and discharges the capacitor. The charging current limit is determined, in the extreme, by the SOA of the device. At room temperature there is no way without additional elements to guarantee that the MOSFET SOA will not be exceeded. At low temperatures, current is not limited by the SOA of the MOSFET and no current limiting elements, such as resistors and diodes, are required. This greatly simplifies the design and implementation. It is especially beneficial in systems with large numbers of devices because the reduction in parts count and the simplification of the circuitry is significant. These advantages will often allow a better circuit layout and thus improved system performance.

Figure 4:
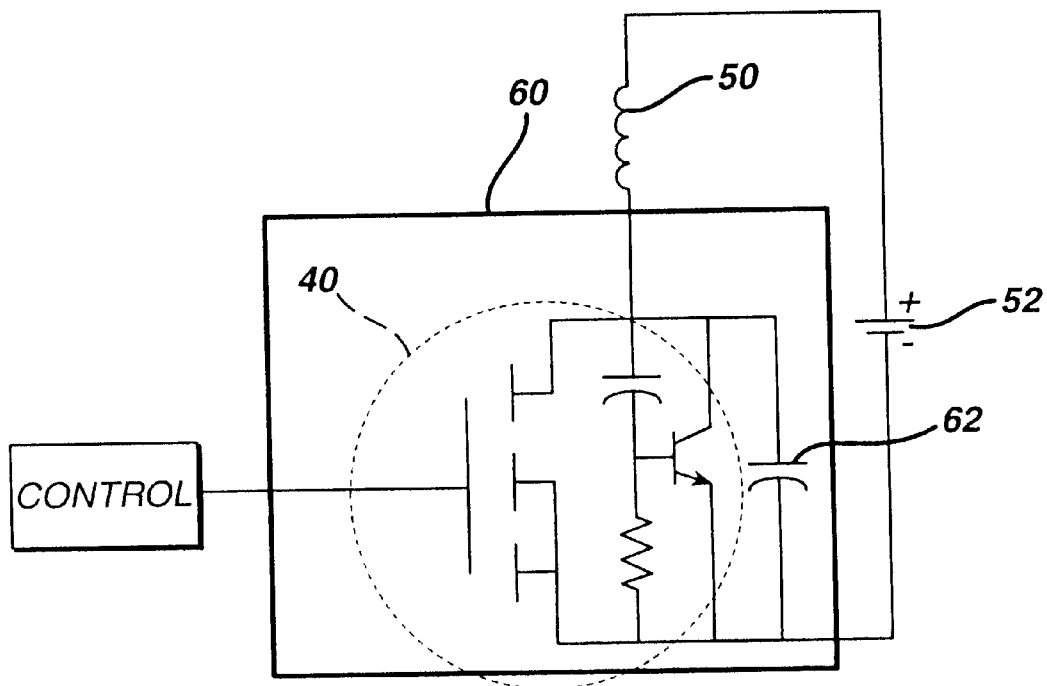
FIG. 4 depicts a snubber according to the invention for use with a electronic circuit including a MOSFET device in a cryogenic environment.

FIG. 4 illustrates the circuit of FIG. 3A, in a cryogenic environment, and including a snubber according to the invention. The snubber, comprising capacitor 62, is connected across the source and drain terminals of the MOSFET 40, as illustrated. The capacitor 62, which may be maintained outside the cryogenic chamber 60, is preferably maintained within it. Likewise, inductive load 52, the control element and current source, may include elements that are both inside and outside the chamber 60.

The cryogenic chamber 60 is maintained at low temperature and, particularly, at HTS temperature ranges, to wit, 20°–77° K (traditional) or 20°–236° K (extended), or LTS temperature ranges, to wit, 4°–20° K. Methods and apparatus for maintaining the chamber 60 at traditional HTS temperature ranges, to wit, 20°–77° K, and at LTS temperature ranges, to wit, 4°–20° K, are known in the art. Methods and apparatus for maintaining the chamber 60 in a temperature range of 90° K–236° K and, preferably, in a temperature range 150° K–170° K are disclosed is co-pending, commonly assigned U.S. patent application Ser. No. 08/698,806, filed this same day herewith (Attorney Docket No. 0019696-0087), the teachings of which are incorporated herein by reference.

At the foregoing temperatures, the MOSFET 40 has the properties of improved (reduced) Rdson and improved thermal conductivity. These properties are well understood in the art. The SOA of a MOSFET 40 is principally determined so as to maintain the junction temperature at a level below which silicon is damaged. Within HTS and LTS temperature ranges, a MOSFET 40 dissipates less power and is more efficient at removal of heat from the semiconductor junction. As a consequence, a MOSFET 40 operating at these temperatures has a greatly expanded SOA.

Those skilled in the art will appreciate that a snubber according to the invention may be used with MOSFET devices that are maintained at still colder or still warmer temperatures then the LTS and HTS temperature ranges referred to herein, so long as the MOSFETs maintain the aforementioned properties.

The capacitor 62 is selected to limit the peak voltage excursion to a safe value, and to limit the rate of change of the drain to source voltage to a value that will not excite the aforementioned parasitic BJT transistor. Again, this will be well understood by those of ordinary skill in the art in view of the teachings herein. For example, referring to the illustration, for a 1000 volt MOSFET driving an inductive load of 200 µhy, and switching a current of 10 amperes at a rate of 200 to 300 amperes/microsecond, the capacitor 62 has a capacity of 100 pf–10,000 pf and, preferably, 1500 pf.

Referring to FIG. 2A, when a MOSFET device has improved performance—especially with respect to reverse recovery time of the intrinsic diode 38—that diode can be used in place of auxiliary, discrete diodes to commutate currents in the MOSFET. This is particularly true when the MOSFET is cooled to cryogenic temperatures. However, use of the diode 38 for commutation is complicated by the fact that it is part of an intrinsic transistor 34, as discussed above. As noted previously, were such a transistor 34 to turn on, it could have disastrous consequences on the MOSFET and any network (i.e., other circuitry) to which it is coupled. Transistor turn on is possible during the recovery of the integral diode 38. As used here, "recovery" refers to the diode's transition from a conducting state to a blocking state, as initiated by the application of reverse voltage across the device.

In order for the intrinsic diode 38 to transition from a conducting state to a blocking state, excess carriers must be removed from the depletion zone 32 of the diode junction. During this time interval, the diode 38 will support current in the negative direction with little change in voltage. This reverse current, which is determined by the other intrinsic devices in the MOSFET, as well as the circuitry to which the MOSFET is coupled, is generally quite large.

Figure 5:
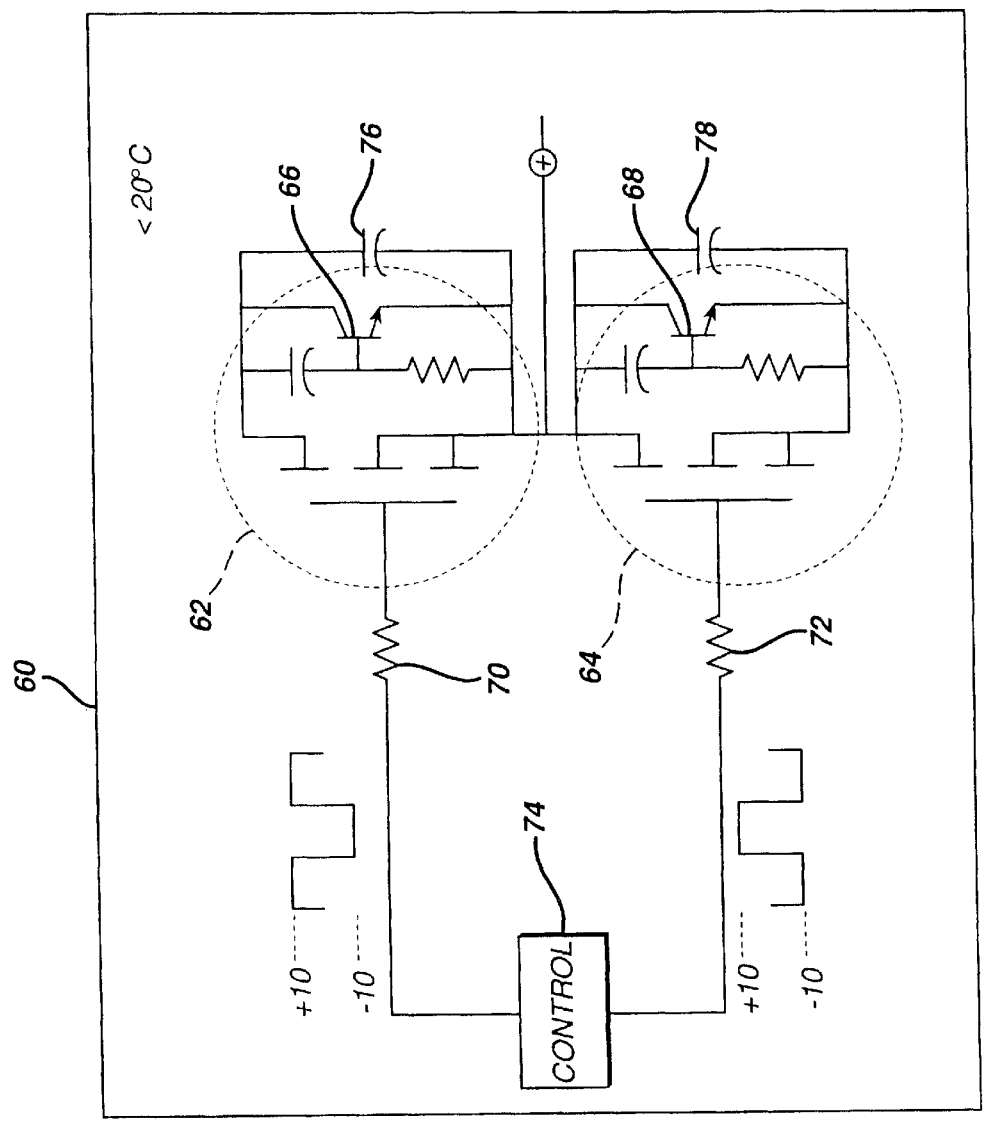
FIG. 5 depicts electronic circuitry according to the invention for preventing overcurrents and overvoltages from harming a MOSFET device in a cryogenic environment.

FIG. 5 shows a bridge circuit in which MOSFET devices 62, 64, maintained in a cryogenic chamber 60, are paired in order to force commutate each other's intrinsic diode, which in the drawing are shown as the transistors 66, 68, of which are part. As above, the chamber is maintained at low temperature and, particularly, at LTS temperatures (i.e., 4° K–20° K) or at traditional or extended HTS temperature ranges (i.e., 20° K–77° K and 20° K–236° K, respectively).

During the switching operation, the MOSFETs 62, 64 operate in a linear mode. Normally, the switching action is designed such that MOSFET 64 is off before MOSFET 62 is turned on, and vice versa. In such a switching action, the inductive load will force the intrinsic diode 68 on. Thus, MOSFET 62 will turn on "into" the active diode 68. Those skilled in the art will recognize this switch sequence as one typical for many power electronic circuits. As MOSFET 62 turns on, the change in current with respect to time, di/dt, is determined by the time course of the gate-to-source voltage, $V_{gs}$. The peak current is determined by this di/dt and the time it takes for the diode to start the recovery process. The recovery process can be described two ways: "soft", meaning that the transition to the blocking state occurs relatively slowly, and "snappy", meaning that this transition occurs relatively quickly.

Whenever the intrinsic diodes 66, 68 turn off, they effect voltage transients that excite the network(s) coupled to the MOSFETs 62, 64, either actual designed networks or "stray" networks created by the lead inductance and stray capacitance. Snappy recovery induces oscillatory transients, of the type shown in FIG. 3B, because the snappy diode transition looks like an impulse excitation.

I have discovered that the magnitude of this impulse excitation and the magnitude of the current peak in the diode can be limited by using a suitably selected gate resistor 70, 72. This controls the rate of current turn on (di/dt) in the MOSFETs 62, 64 and, thereby, limit the current in their intrinsic diode, effectively reducing the impulse excitation of the parasitic resonant network. Although a suggestion is made to use such a gate resistor, in Mohan, *Power Electronics* (2nd Ed.), at Section 22-6-4, that text is silent as to the parameters for selection of the resistor.

Particularly, I have discovered that the resistors 70, 72 should be selected in conjunction with the selection of capacitors 76,78, in accordance with two principles: First, the principle that a smaller value resistor will allow the MOSFET to switch faster, and have the benefit of reduced switching loss, and second the principle that the rate of change of the drain to source voltage must be limited to a value below which the parasitic BJT will be turned on. The selection of these two elements are interactive, meaning that the rate of change of the drain to source voltage can be affected by either the resistor 70,72, or the capacitor 76,78. Many combinations of these elements will meet the criteria, but in general, the combination that provides the minimum resistor and the minimum capacitor will be preferred.

For example, for a bridge circuit as shown in FIG. 5, in which a pair of 1000 volt MOSFETs 62, 64, maintained in chamber 60 at HTS or LTS temperatures, are driven by a gate-to-source voltage of 10 volts providing a drain to source current with a di/dt of 200 to 300 amperes/microsecond, the resistors 70, 72 have resistances of 1 ohm–100 ohms and, preferably, 49.9 ohms.

Although the resistors 70, 72 are shown in use in a bridge topology, those skilled in the art will appreciate that such resistors may be used with MOSFET 62, 64 whenever it is desired to limit the turn on rate of current through the diodes.

I have discovered, further, that the MOSFETs 62, 64 can be immunized from erroneous turn on resulting from capacitive coupling via drain-to-gate capacitor $C_{gd}$ (see FIG. 2A) by applying a significant negative voltage to the gate. This has the effect of raising the required charge to bring the gates 12 (see FIG. 2A) of the MOSFETs 62, 64 to the conduction voltage. Since the amount of couple charge is a function of the dv/dt, by selecting the maximum dv/dt, the required negative bias necessary to ensure that the device does not turn on can be determined.

FIG. 5 illustrates such a use of a negative voltage applied to the MOSFET gates. Particularly, control circuitry 74 drives gates the of MOSFETs 63, 64 with gate-to-source voltages that range from −10 to +10 volts. As usual, the MOSFETs 62, 64 are switched on when their respective gate-to-source voltages exceed $V_{TH}$; otherwise, they are switched off. However, when the gate-to-source voltages fall below 0 volts, negative charges are stored in the respective gate-to-source capacitors, $C_{gs}$, thereby immunizing the MOSFETs from turn on via coupling through the gate-to-drain capacitors, $C_{gd}$, The control circuitry, which otherwise operates in the conventional manner known in the art, drives the gate-to-source voltages far enough below 0 volts to prevent the voltage injected by the drain to gate capacitance $C_{gd}$ from becoming positive when operating at the maximum dv/dt. For example, for MOSFETs 62, 64, maintained in chamber 60 at HTS or LTS temperatures, switching a current of 10 amps at a rate of 200 amps/microsecond, gate-to-source voltage is taken 5 volts negative and, preferably, 10 volts negative whenever the respective MOSFET is switched off.

Although the negative-going gate voltages are shown in use in a bridge topology, those skilled in the art will appreciate that negative-going voltages may be used whenever it is desired to immunize MOSFETs 62, 64 from turn on via coupling through their respective drain-to-gate capacitors $C_{gd}$.

As further shown in FIG. 5, the operation of MOSFETs devices 62, 64 at cryogenic temperatures can be improved by combining capacitive snubbers 76, 78, as shown, in combination with gate resistors 70, 72 and negative-going gate-to-source voltages. In a half-bridge topology of the type shown, used in a cryogenic chamber maintained at HTS or LTS temperatures, for driving a current of 10 amps at switching speeds of 250 amps/microsecond, using 1000 volt MOSFETs 62, 64, the capacitors 76, 78 have capacitances of 1000 pf–2000 pf and, preferably, 1500 pf; the resistors 70, 72 are rated at 40–60 ohms and, preferably, 49.9 ohms; and the gate-to-source voltage is driven 10 volts negative whenever the respective MOSFET is switched off.

Described above are devices and methods meeting the objects of this invention. Those skilled in the art will appreciate that the embodiments herein are merely disclosed by way of example, and that other embodiments employing modifications thereto fall within the scope of the invention. Thus, for example, it will be appreciated that while the MOSFET described above and shown in the illustrations is an n-type MOSFET device, the invention is equally applicable to p-type MOSFET devices. In view of the foregoing, what I claim is:

1. An improved snubber for coupling the source and drain terminals of a first MOSFET device operating at cryogenic temperatures and controlled by a control element that alternately turns on the first MOSFET device and a second MOSFET device such that the first MOSFET is turned off before the second MOSFET is turned on, the snubber consisting essentially of a capacitor having a capacitance such that, when the control element turns on the second MOSFET device at a predetermined rate, the rate of change of the drain to source voltage is restricted to a value below that at which a bipolar junction transistor inherent to the first MOSFET will be turned on.

2. An improved snubber for coupling the source and drain terminals of a fist MOSFET device operating at cryogenic temperatures and controlled by a control element that alternately turns on the first MOSFET device and a second MOSFET device such that the first MOSFET is turned off before the second MOSFET is turned on, the snubber comprising a load having capacitance but substantially no resistance, wherein the value of the capacitance is sufficient to restrict the rate of change of the drain to source voltage to a value below that at which a bipolar junction transistor inherent to the first MOSFET will be turned on when the control element turns on the second MOSFET device at a predetermined rate.

3. An improved snubber according to any of claims 1 and 2, wherein the MOSFET device operates substantially at or below 236° K.

4. An improved snubber according to claim 3, wherein the MOSFET device operates at temperatures substantially at or below 170° K.

5. An improved snubber according to claim 3, wherein the MOSFET device operates at temperatures substantially at or below 150° K.

6. An improved snubber according to claim 3, wherein the MOSFET device operates at temperatures substantially at or below 90° K.

7. An improved snubber according to claim 3, wherein the MOSFET device operates at temperatures substantially at or below 77° K.

8. An improved snubber according to claim 3, wherein the MOSFET device operates at temperatures substantially at or below 20° K.

9. In an electronic circuit comprising a first and a second MOSFET device each having, source, drain, and gate terminals and operating at cryogenic temperatures and a control element for alternately effecting conduction in the MOSFET devices by selectively applying a voltage to the gate terminal that is positive with respect to the source terminal and with respect to ground such that the first MOSFET is turned off before the second MOSFET is turned on, the improvement comprising a snubber connected between the source and drain terminals of the MOSFET device, the snubber having capacitance and substantially no resistance and the capacitance of the snubber being selected such that, when a voltage is applied to the gate terminal of the second MOSFET at a predetermined rate, the rate of change of the drain to source voltage is restricted to a value below that at which a bipolar junction transistor inherent to the MOSFET will be turned on.

10. In an electronic circuit according to claim 9, wherein the snubber comprises a capacitor.

11. In an electronic circuit according to claim 9, wherein the snubber consists essentially of a capacitor.

12. In an electronic circuit according to claim 9, wherein the snubber has a capacitance selected in order to limit a peak voltage in the MOSFET device to a level that is not destructive thereto and to limit the rate of change of a drain-to-source voltage of the MOSFET device to a value that will not turn on a BJT transistor inherent to the MOSFET device.

13. In an electronic circuit according to claim 9, wherein the MOSFET device operates at temperatures substantially at or below 236° K.

14. In an electronic circuit according to claim 9, wherein the MOSFET device operates at temperatures substantially at or below 170° K.

15. In an electronic circuit according to claim 9, wherein the MOSFET device operates at temperatures substantially at or below 150° K.

16. In an electronic circuit according to claim 9, wherein the MOSFET device operates at temperatures substantially at or below 90° K.

17. In an electronic circuit according to claim 9, wherein the MOSFET device operates at temperatures substantially at or below 77° K.

18. In an electronic circuit according to claim 9, wherein the MOSFET device operates at temperatures substantially at or below 20° K.

19. An electronic circuit comprising:

a MOSFET device having source, drain and gate terminals and operating at cryogenic temperatures;

a resistive load connected to the gate terminal of the MOSFET device;

a snubber connected between the source and drain terminals of the MOSFET device, the snubber having capacitance and substantially no resistance, the capacitance of the snubber being selected based on a resistance of the resistive load such that the combination of the capacitor and the resistive load regulates the rate of change of the drain to source voltage to a value below which a bipolar junction transistor inherent to the MOSFET will be turned on; and a control element coupled to the resistor for effecting conduction in the MOSFET device by selectively applying a voltage to the gate terminal that is positive with respect to the source terminal and with respect to ground.

20. An electronic circuit according to claim 19, wherein the resistive load comprises a resistor.

21. An electronic circuit according to claim 19, wherein the resistance of the resistive load and capacitance of the snubber are selected such that, together, they limit a rate of change of a drain-to-source voltage to a value that will not turn on a BJT transistor inherent to the MOSFET device.

22. An electronic circuit according to claim 19, wherein the control element selectively applies a voltage to the gate terminal that is negative with respect to the source terminal and with respect to ground.

23. An electronic circuit according to claim 22, wherein the control element periodically applies to the gate terminal a voltage that is negative with respect to the source terminal and with respect to ground.

24. An electronic circuit according to claim 22, wherein the control element effects conduction in the MOSFET by selectively applying a voltage to the gate terminal that is positive with respect to the source terminal and with respect to ground and, otherwise, applies to the gate terminal a voltage that is negative with respect to the source terminal and with respect to ground.

25. An electronic circuit according to claim 24, wherein the control element applies to the gate terminal a voltage that is sufficiently negative with respect to ground to prevent a voltage injected by a drain-to-gate capacitance of the MOSFET device from becoming positive when operating at a maximum rate of change of drain-to-source voltage across the MOSFET device.

26. An electronic circuit according to claim 19, wherein the MOSFET device operates at temperatures substantially at or below 236° K.

27. An electronic circuit according to claim 26, wherein the MOSFET device operates at temperatures substantially at or below 170° K.

28. An electronic circuit according to claim 26, wherein the MOSFET device operates at temperatures substantially at or below 150° K.

29. An electronic circuit according to claim 26, wherein the MOSFET device operates at temperatures substantially at or below 90° K.

30. An electronic circuit according to claim 26, wherein the MOSFET device operates at temperatures substantially at or below 77° K.

31. An electronic circuit according to claim 26, wherein the MOSFET device operates at temperatures substantially at or below 20° K.

* * * * *